United States Patent [19]
Sakashita et al.

[11] Patent Number: 4,995,039
[45] Date of Patent: Feb. 19, 1991

[54] CIRCUIT FOR TRANSPARENT SCAN PATH TESTING OF INTEGRATED CIRCUIT DEVICES

[75] Inventors: Kazuhiro Sakashita; Ichiro Tomioka; Takeshi Hashizume, all of Hyogo, Japan

[73] Assignee: Mitsubishi Denki Kabushiki Kaisha, Tokyo, Japan

[21] Appl. No.: 247,289

[22] Filed: Sep. 22, 1988

[30] Foreign Application Priority Data

Sep. 25, 1987 [JP] Japan ................ 62-242320

[51] Int. Cl.$^5$ ................ G01R 15/12; G01R 31/28
[52] U.S. Cl. ................ 371/22.3
[58] Field of Search ........... 324/73 R, 73 AT, 73.1; 371/22.3, 15.1

[56] References Cited

U.S. PATENT DOCUMENTS

| | | | |
|---|---|---|---|
| 4,580,066 | 4/1986 | Berndt | 307/291 |
| 4,698,588 | 10/1987 | Hwang et al. | 371/22.3 |
| 4,710,931 | 12/1987 | Bellay et al. | 371/22.3 |
| 4,710,933 | 12/1987 | Powell et al. | 324/73 R |
| 4,764,926 | 8/1988 | Knight et al. | 371/22.3 |
| 4,780,666 | 10/1989 | Sakashita et al. | 371/22.3 |

FOREIGN PATENT DOCUMENTS

3725021A1 2/1988 Fed. Rep. of Germany.
5674668A 11/1979 Japan.

OTHER PUBLICATIONS

S. DasGupta, "An Enhancement to LSSD and Some Applications of LSSD in Reliability, Availability, and Serviceability", *The Proceedings of the International Symposium on Fault Tolerant Computers*, (1980): 32,34.

*Primary Examiner*—Reinhard J. Eisenzopf
*Assistant Examiner*—W. Burns
*Attorney, Agent, or Firm*—Lowe, Price, LeBlanc, Becker & Shur

[57] ABSTRACT

In a circuit for testing integrated circuit devices, scan registers (8~16) and data selecting circuits (20-28) are connected between a plurality of circuit blocks (29~31) in correspondence with the number of bits of the data, with the scan registers connected to each other by a shift register path so as to have a function of one shift register as a whole. A register selecting circuit (20~28) is connected to a clock input terminal (T1, T2) of the scan register. The scan registers other than those corresponding to the logic circuit block to be tested are selected by the register selecting circuit. Consequently, clocks for scanning scan registers other than those provided before and after the required circuit block are eliminated, enabling reduction of time required for scan test.

13 Claims, 7 Drawing Sheets

CIRCUIT FOR TRANSPARENT SCAN PATH TESTING OF INTEGRATED CIRCUIT DEVICES

BACKGROUND OF THE INVENTION

1. Field of the Invention

The present invention relates to a circuit for testing integrated circuit devices. More particularly, the present invention relates to a circuit for testing integrated circuit devices employing a scan path.

2. Description of the Prior Art

The degree of integration of integrated circuits has been improved rapidly by virtue of the progress in minute processing technique, and is expected to be further improved in future. As the degree of integration is improved, that is, the number of gates are increased, the difficulty in testing integrated circuit devices has been exponentially enhanced. Now, how easily a device can be tested is determined by two factors, namely, how easily defects in the circuits connected to terminals are detected, i.e. observability, and how easily the terminals are set at desirable logic values, i.e. controllability. In general, in a large scale logic circuit network, both monitoring and controlling of a terminal which is not easily accessed on the circuit become difficult.

A scan test method is known as an example of a method for testing integrated circuit devices. In the scan test method, register circuits having the function of shift registers are inserted at appropriate portions in the logic circuit network. These register circuits are connected by one shift register path. In testing, a test pattern is serially inputted from outside the chip to set prescribed data in respective registers. A desired logic signal is applied to a logic circuit connected to a data output terminal of each of these registers to effect logic operation. The result is taken in to the register from a parallel input terminal of the register, and the data is serially outputted outside the chip. By monitoring the outputted data, the ease in monitoring and controlling of a terminal which is not easily accessed can be enhanced in a large scale logic circuit network.

Figure 1:
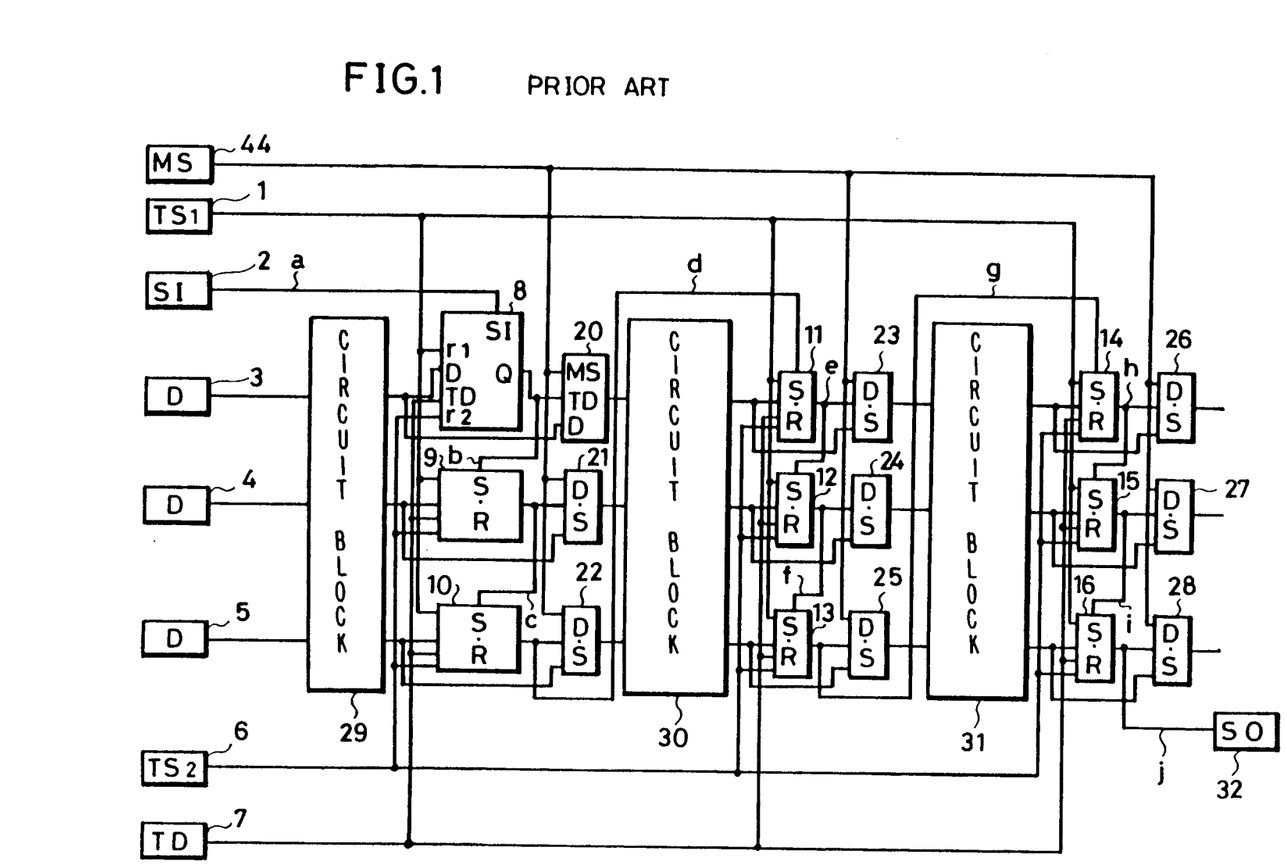
FIG. 1 is a block diagram showing a conventional circuit for testing integrated circuit devices.

FIG. 1 is a block diagram showing an example of a conventional scan path type test circuit. In FIG. 1, the test circuit is for testing circuit blocks 29, 30 and 31. Scan registers 8, 9 and 10 and data selectors 20, 21 and 22 are connected between the circuit blocks 29 and 30. The data selectors 20, 21 and 22 select either the output of the circuit block 29 or the outputs from the scan registers 8, 9 and 10 to output the same to the circuit block 30 of the succeeding stage.

In the similar manner, scan registers 11, 12 and 13 and data selectors 23, 24 and 25 are connected between the circuit blocks 30 and 31. The data selectors 23, 24 and 25 respectively select either the output of the circuit block 30 or the outputs of the scan registers 11, 12 and 13 to output the same to the circuit block 31 in the succeeding stage. In addition, scan registers 14, 15 and 16 and data selectors 26, 27 and 28 are connected to the output of the circuit block 31. These data selectors 26, 27 and 28 select either the output of the circuit block 31 or the outputs of the scan registers 14, 15 and 16 to output the same.

Output ends of respective circuit blocks 29 to 31 are connected to the data input terminals D of the scan registers 8 to 16 and to the data input terminals D of the data selectors 20 to 28. The test data input terminals TD of the data selectors 20 to 28 are connected to output terminals Q of the corresponding scan registers. The test mode selecting terminal 44 is connected to respective mode selecting terminals MS of the data selectors 20 to 28. A scan in terminal 2 is connected to a scan in terminal SI of the scan register 8, and an output terminal Q of the scan register 8 is connected to the scan in terminal SI of the scan register 9. Similarly, output terminals of the scan registers 9 to 16 are respectively connected to the scan in terminals SI of the scan registers in the succeeding stage. As a result, a shift register path is formed between the scan in terminal 2 and a scan out terminal 32.

A normal data is inputted to the circuit block 29 in the first stage through data input terminals 3 to 5. In correspondence with scan clock input terminals T1 and data clock input terminals TD of the scan registers 8 to 16, clock input terminals 1 and 7 are provided, and the clock signals applied thereto also serve as signals for selecting input data latched by the scan register 8 in the first stage. A clock signal for transferring data inputted and held in the scan register 8 of the first stage to the latch of the second stage provided in the scan register 8 is inputted to the clock input terminal 6.

Figure 2:
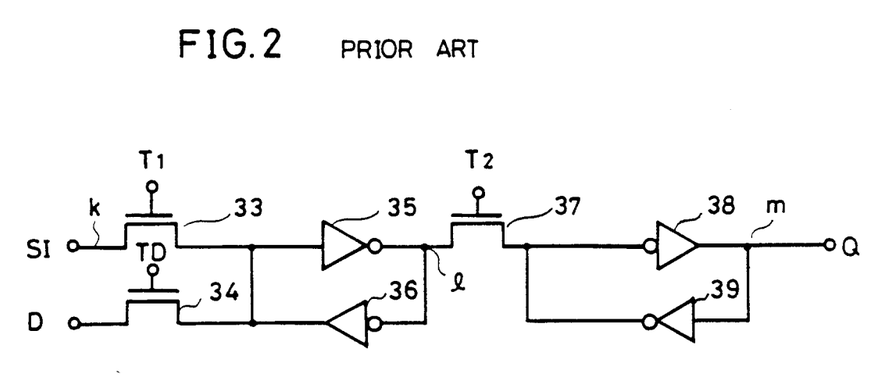
FIG. 2 is a circuit diagram showing one example of the scan register shown in FIG. 1.

FIG. 2 is a circuit diagram showing one example of the scan register shown in FIG. 1. In FIG. 2, inverters 35 and 36, and 38 and 39 respectively constitute latch circuits. The latch circuit in the preceding stage and the latch circuit in the succeeding stage are connected with each other by a transmission gate 37 formed of an n type MOS transistor. The transmission gate 37 becomes conductive in response to a clock signal inputted to a second scan clock input terminal T2, whereby the output of the latch circuit in the preceding stage is latched in the latch circuit in the succeeding stage. Transmission gates 33 and 34 constituted by n type MOS transistors are connected to the latch circuit in the preceding stage. A scan clock signal inputted to the first scan clock input terminal T1 is applied to the gate of the transmission gate 33. The transmission gate 33 latches the scan data inputted to the scan in terminal SI in the latch circuit 35 of the preceding stage in response to the scan clock signal. The transmission gate 34 latches the data inputted to the data input terminal D in the latch circuit of the preceding stage in response to a clock signal inputted to the data clock input terminal TD connected to the gate thereof.

Figure 3:
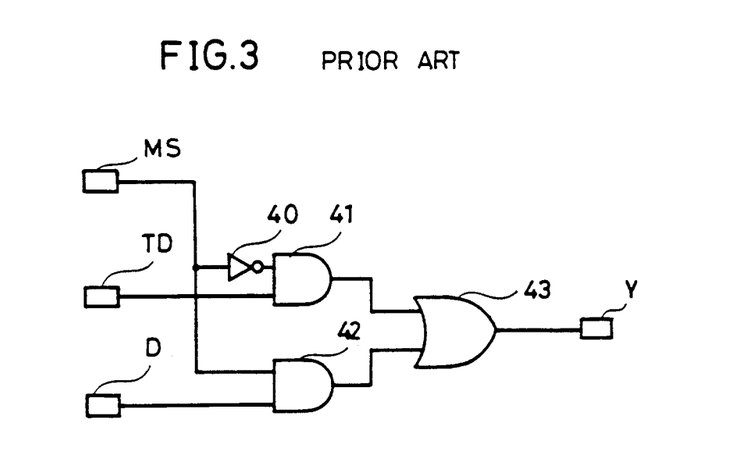
FIG. 3 is a circuit diagram of the data selector circuit shown in FIG. 1.

FIG. 3 is a circuit diagram showing one example of the data selector shown in FIG. 1. In FIG. 3, a mode switching signal is applied to the mode selecting terminal MS. The mode switching signal is applied to one input end of the AND gate 42 and is inverted by an inverter 40 to be applied to one input end of the AND gate 41. A test data is inputted to the other input end of the AND gate 41 from the test data input terminal TD, and data is inputted to the other input end of the AND gate 42 from the data input terminal D. Respective outputs of the AND gates 41 and 42 are outputted at an output terminal Y through an OR gate 43.

Figure 4:
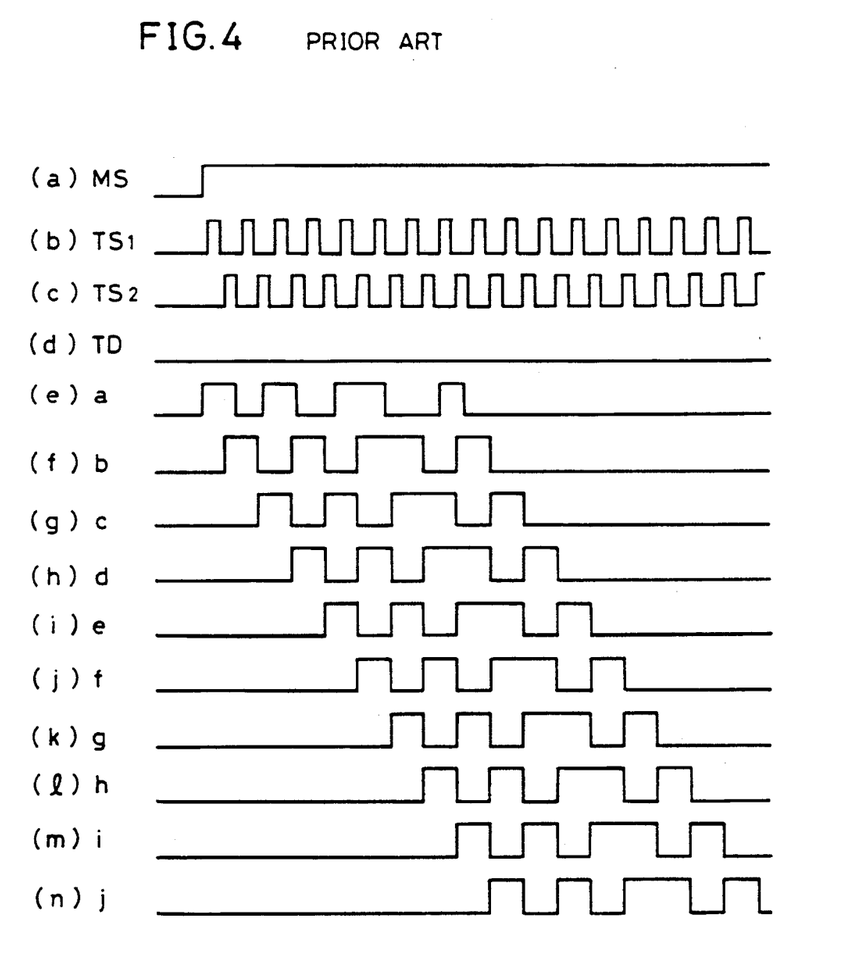
FIG. 4 is a timing diagram showing timing of each portion of FIG. 1.
Figure 5:
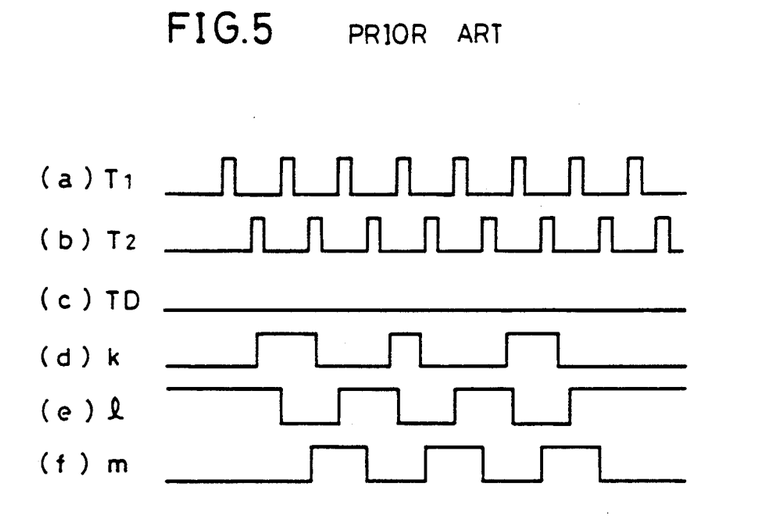
FIG. 5 is a timing diagram showing timing of each portion of scan register shown in FIG. 2.
Figure 6:
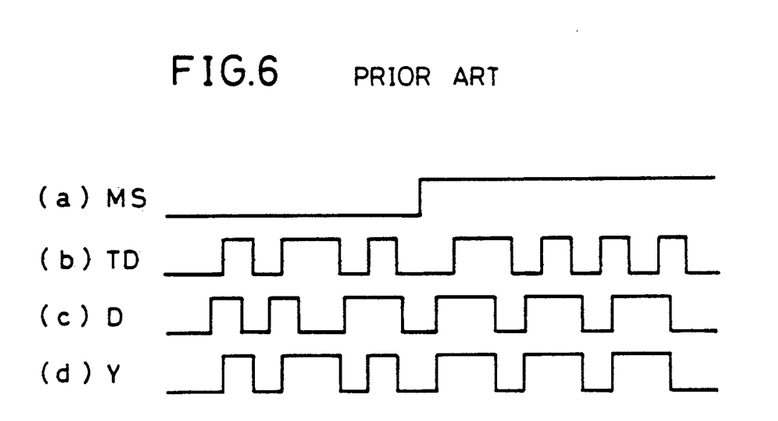
FIG. 6 is a timing diagram showing timing of each portion of the data selector circuit shown in FIG. 3.

FIG. 4 is a timing diagram for illustrating the operation of the circuit shown in FIG. 1, FIG. 5 is a timing diagram for illustrating the operation of the scan register shown in FIG. 2, and FIG. 6 is a timing diagram for illustrating the operation of the data selector shown in FIG. 3.

The operation of the conventional circuit for testing semiconductor devices will be described in the following with reference to FIGS. 1 to 6.

First, description will be given of an normal operation. In this case, a "H" level signal is inputted as a test mode switching signal to the test mode selecting terminals 44, and the scan clock terminal 1 and the data clock terminal 7 are both set at "L" level. Consequently, input and output terminals of the corresponding circuit blocks 29, 30 and 31 are directly connected through respective data selectors 20 to 28.

More specifically, when a "H" level signal is applied to the mode selecting terminal MS of the data selector shown in FIG. 3, the AND gate 42 is opened and the data inputted to the data input terminal D is outputted to the output terminal Y through the AND gate 42 and the OR gate 43. Since respective outputs of the circuit blocks 29, 30 and 31 are directly connected to the data input terminals D of the data selectors 20 to 28, the input and output terminals between corresponding circuit blocks are directly connected with each other.

Meanwhile, in the test operation, the scan mode and test mode are successively repeated in the following manner to carry out testing of each circuit block.

(1) Scan Mode

In the scan mode, a "H" level signal is inputted to the test mode selecting terminal 44 as shown in FIG. 4(a) to set the scan mode. Consequently, each of the data selectors 20 to 28 outputs data inputted to the data input terminal D to the output terminal Y. Test data to be set in each of the scan registers 8 to 16 such as shown in FIG. 4(e) are inputted from the scan in terminal 2. These test data are successively scanned in to the scan registers 8 to 16 in synchronization with a first scan clock signal applied to the first scan clock terminal such as shown in FIG. 4(b) and with a second scan clock signal applied to the second scan clock terminal 6 such as shown in FIG. 4(c). The data clock input terminal 7 is set at a "L" level as shown in FIG. 4(d).

At the same time, output data of each of the circuit blocks 29 to 31 which were taken in at the last testing are successively scan-out from the scan out terminal 32. Description will be given in detail with reference to FIGS. 2 and 3.

First, in the scan register, the load drivability of the inverters 36 and 39 is smaller than that of the inverters 35 and 38. Therefore, when a clock signal shown in FIG. 5(a) is applied to the first scan clock terminal T1, the transmission gate 33 is opened and the data inputted to the scan in terminal SI such as shown in FIG. (d) is inputted and held in the latch circuit constituted by the inverters 35 and 36 (FIG. 5(e)). At the same time, the data held in the latch circuit constituted by the inverters 38 and 39 are outputted from the output terminal Q (FIG. 5(f)) and inputted to a succeeding scan register through a scan path.

On this occasion, a "H" level signal is also applied to the mode selecting terminal MS of the data selector, so that the data from the data input terminal D is outputted to the output terminal Y.

(2) Test Mode

When desired data are set in each of the scan registers 8 to 16, a "L" level signal is applied to the test mode selecting terminal 44 to select the test mode. Consequently, output data from the scan registers 8 to 16 are applied to each of the circuit blocks 30 and 31 through the test data input terminals TD of the data selectors 20 to 28. At the same time, additional desired test data are applied to the data input terminals 3 to 5. Thereafter, when the operation of the circuit blocks 29 to 31 are completed, one clock signal is applied to the data clock input terminal 7. Consequently, output signals of each of the circuit blocks 29 to 31 are held in the latch circuit in the respective scan registers 8 to 16 through the data input terminals D of the corresponding scan registers 8 to 16.

The operation will be described in the following with reference to FIGS. 2, 3, 5 and 6. First, in the scan register, when a clock signal shown in FIG. 6(b) is applied to the first scan clock terminal TD, the transmission gate 34 is opened and the data shown in FIG. 6(c) applied to the data input terminal D is inputted and held in the latch circuit of the first stage. On this occasion, since a "L" level mode selecting signal such as shown in FIG. 6(a) is applied to the mode selecting terminal MS of the data selector, the data from the test data input terminal TD such as shown in FIG. 6(d) is outputted to the output terminal Y. When one clock signal shown in FIG. 5(b) is applied to the next second scan clock terminal T2, the data in the latch circuit in the first stage of the scan register is shifted to the latch circuit of the second stage.

As described above, in a conventional circuit for testing semiconductor devices, the scan-in operation for setting test data in each of the scan registers 8 to 16 in the scan mode and the scan out operation for transmitting output data of each of the circuit blocks 29 and 30 taken in to the last testing should be in synchronization with clock signals, respectively, and the data should be successively transmitted through all scan registers 8 to 16 as shown in FIG. 4 (e) to n. Therefore, extra clock signals are required for the scan register group other than the scan registers provided before and after the test circuit block directly requiring the data, making it difficult to carry out the scan test in a short period of time.

SUMMARY OF THE INVENTION

Therefore, an object of the present invention is to provide a circuit for testing integrated circuit devices capable of reducing time required for scan test.

Briefly stated, the present invention comprises scan registers provided between a plurality of logic circuit blocks in correspondence to the number of bits of the data to be transferred, the scan registers being connected with each other by a shift register path so as to serve as one shift register as a whole, and the data outputted from the logic circuit block of the preceding stage or the test data are stored in the scan register in synchronization with a clock signal in the test operation. A data selecting circuit is connected to an output terminal of each scan register. In the normal operation, the output data of the corresponding logic circuit block in the preceding stage is selected, while in the test operation, the output data of the corresponding scan register is selected, with the selected data outputted to the logic circuit block of the succeeding stage. In addition, a register selecting circuit is provided for making through, i.e. making selected scan registers transparent other than the scan registers corresponding to the logic circuit block to be tested.

Therefore, according to the present invention, the scan register circuits other than the scan register circuit corresponding to the logic circuit block to be tested are made transparent, reducing the time required for scan test.

In a preferred embodiment, a mode switching signal is inputted to the mode switching signal input terminal for selecting one of a normal operation mode in which output signals of the logic circuit block in the preceding stage are outputted to the logic circuit block of the succeeding stage, a scan mode in which test data are scanned by each scan register, and a test mode in which data set in each of the scan registers are outputted to the logic circuit block of the succeeding stage in parallel for testing the corresponding logic circuit block. Each scan register outputs output signals of the corresponding logic circuit block to the logic circuit block of the succeeding stage in response to the application of the normal operation mode signal; serially scans test data in response to the input of the scan mode signal; and outputs stored data in response to the application of the test mode signal.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 7:
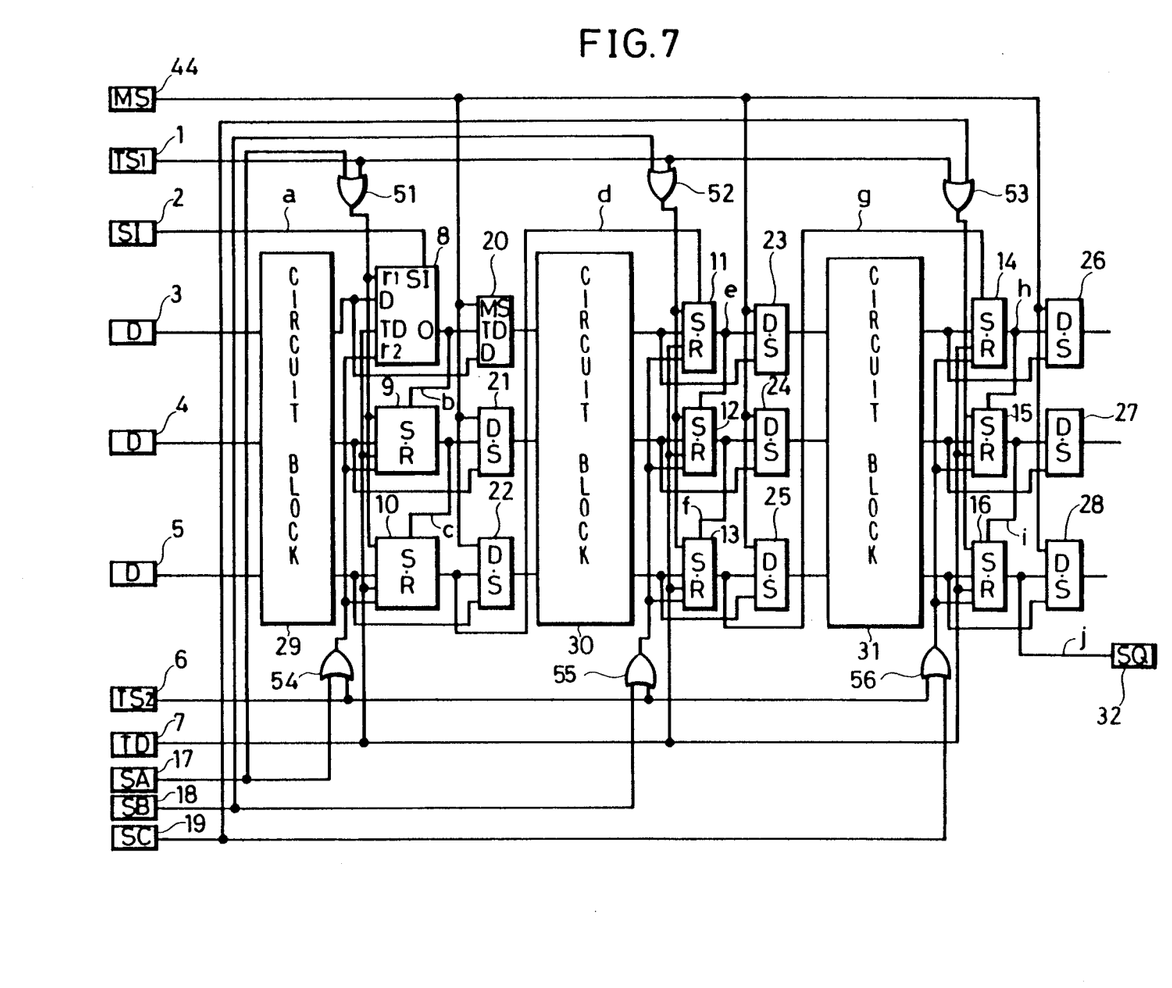
FIG. 7 is a block diagram of one embodiment of the present invention.

FIG. 7 is a block diagram of one embodiment of the present invention.

Referring to FIG. 7, the present embodiment comprises circuit blocks 29, 30 and 31, scan registers 8 to 16 and data selecting circuits 20 to 28 as in the above described circuit of FIG. 1. Register selecting terminals 17, 18 and 19 are further provided. Register selecting signals for making transparent the scan registers other than the scan registers corresponding to the circuit block to be tested are applied to the register selecting terminals 17, 18 and 19. The register selecting signal inputted to the register selecting terminal 17 is applied to one input end of each of the OR gates 51 and 54; the register selecting signal inputted to the register selecting terminal 18 is applied to one input end of each of the OR gates 52 and 55; and the register selecting signal inputted to the register selecting terminal 19 is applied to one input end of each of the OR gates 53 and 56.

Test mode selecting signals are applied from the test model selecting terminal 1 to the other input end of each of the OR gates 51, 52 and 53. Scan clock signals are applied to the other input end of each of the OR gates 54, 55 and 56. The output of the OR gate 51 is connected to the scan clock input terminal T1 of each of the scan registers 8, 9 and 10; the output of the OR gate 52 is connected to the scan clock input terminal T1 of each of the scan registers 11, 12 and 13; and the output of the OR gate 53 is connected to the scan clock input terminal T1 of each of the scan registers 14, 15 and 16. The output of the OR gate 54 is connected to the second clock input terminal T2 of each of the scan registers 8, 9 and 10; the output of the OR gate 55 is connected to the second clock input terminal T2 of each of the scan registers 11, 12 and 13; and the output of the OR gate 56 is connected to the second clock input terminal T2 of each of the scan registers 14, 15 and 16. Other structure is the same as that of FIG. 1.

Figure 8:
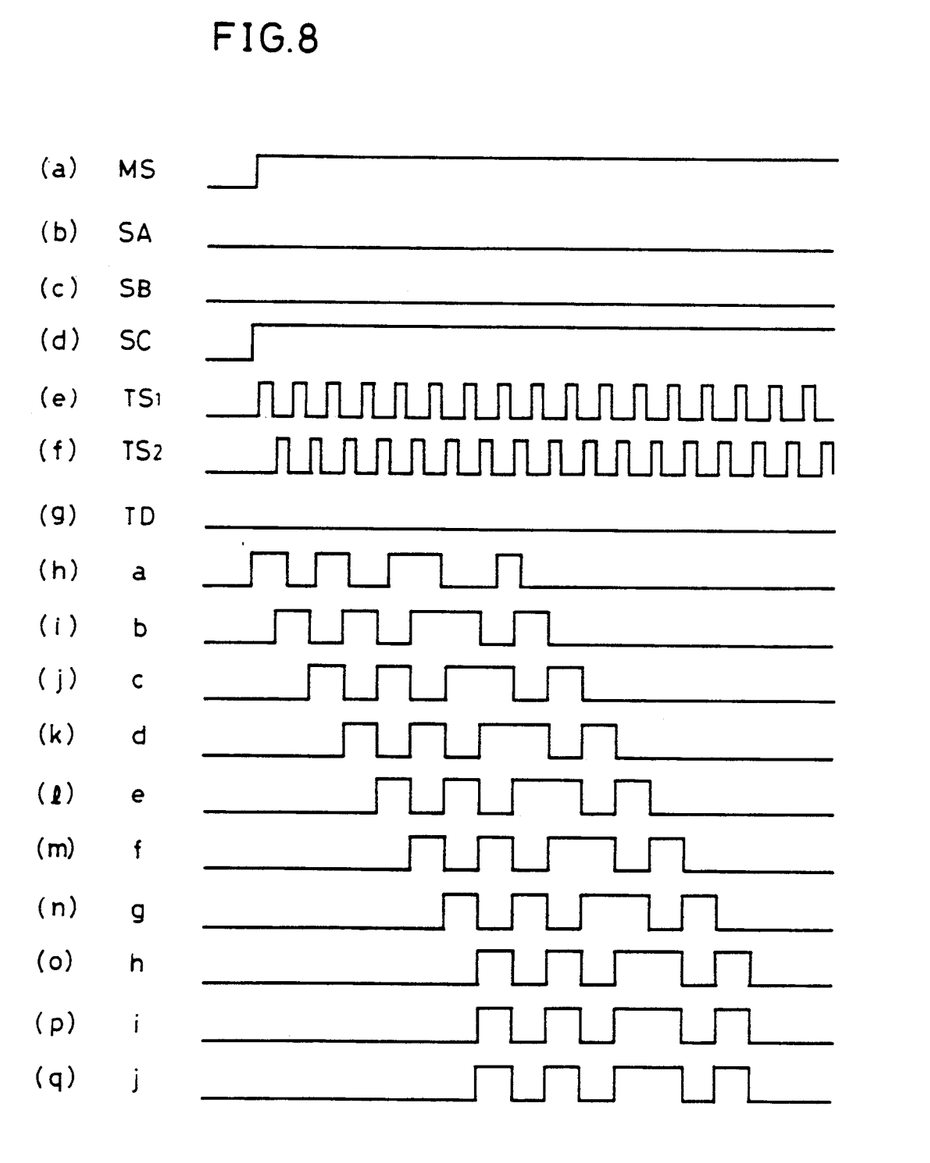
FIG 8 is a timing diagram of each portion of FIG. 7.

FIG. 8 is a timing diagram showing the operation of each portion of FIG. 7.

The operation of one embodiment of the present invention will be described in the following with reference to FIGS. 7 and 8. Since the normal operation mode and the test mode are the same as those of the circuit shown in FIG. 1, the description thereof will be omitted. In the scan mode, a "H" level signal is applied to the mode selecting terminal 44 as shown in FIG. 8(a). The "H" level signal is applied to the data selecting circuits 20 to 28 and respective AND gates 42 are opened. Consequently, the output data of the circuit blocks 29 and 30 in the preceding stages are respectively applied to the circuit blocks 30 and 31 through the data selecting circuits 20 to 22 and 23 to 25.

Then, scan registers other than those provided before and after the circuit block to be tested are made transparent. More specifically, in FIG. 7, for example, only the scan registers 8 to 13 are required for testing the circuit block 30, and other scan registers 14 to 16 are made transparent. For this purpose, a "H" level signal shown in FIG. 8(d) is applied to the register select terminal 19 corresponding to the scan registers 14 to 16 and a "L" level signal is applied to other register select terminals 17 and 18 as shown in FIG. 8(b) and (c). When a "H" level signal is applied to the register selector terminal 19, the outputs of the OR gates 53 and 56 are forced to be at the "H" level. Consequently, the transfer gates 33 and 37 of the scan registers 14 to 16 shown in FIG. 2 become conductive, and the latch circuits respectively constituted by the inverters 35 and 36 and inverters 38 and 39 operate simply as inverters, thereby allowing the data to asynchronously pass directly through the scan registers without delay.

Thereafter, test data such as shown in FIG. 8(h) is inputted to be set in each of the scan registers 8 to 13 from the scan in terminal 2. In addition, scan clock signals such as shown in FIG. 8(e) and (f) are inputted to the first scan clock terminal 1 and the second scan clock terminal 6. On this occasion, the data clock input terminal 7 is fixed at a "L" level as shown in FIG. 8(g) the scan data serially inputted to the scan register 8 is successively scanned by the scan registers 9, 10, 11, 12 and 13 in response to the first and second scan clock signals, and the scanned data is successively outputted at the outputs of the respective scan registers 9 to 13 as shown in FIG. 8(i) to (n). Since the scan registers 14 to 16 are made transparent the scan data are simultaneously outputted as shown in FIG. 8(o) to (q). Therefore, it is apparent when compared with the timing diagram of the conventional circuit shown in FIG. 4, that the data is outputted from the serial in input terminal 2 to the scan out output terminal 32 in a clock shorter than that of the prior art by three periods.

As described above, according to one embodiment of the present invention, OR gates 51 to 56 as register selector circuits are connected to the first and second scan clock input terminals of the scan registers 8 to 16, whereby the scan registers other than those corresponding to the logic circuit block to be tested can be made transparent to reduce the time required for the scan test. More specifically, in the scan mode, only the required number of scan registers can be selected through which the test data is successively shifted, whereby the number of clocks required for scan in and scan out can be reduced.

Figure 9:
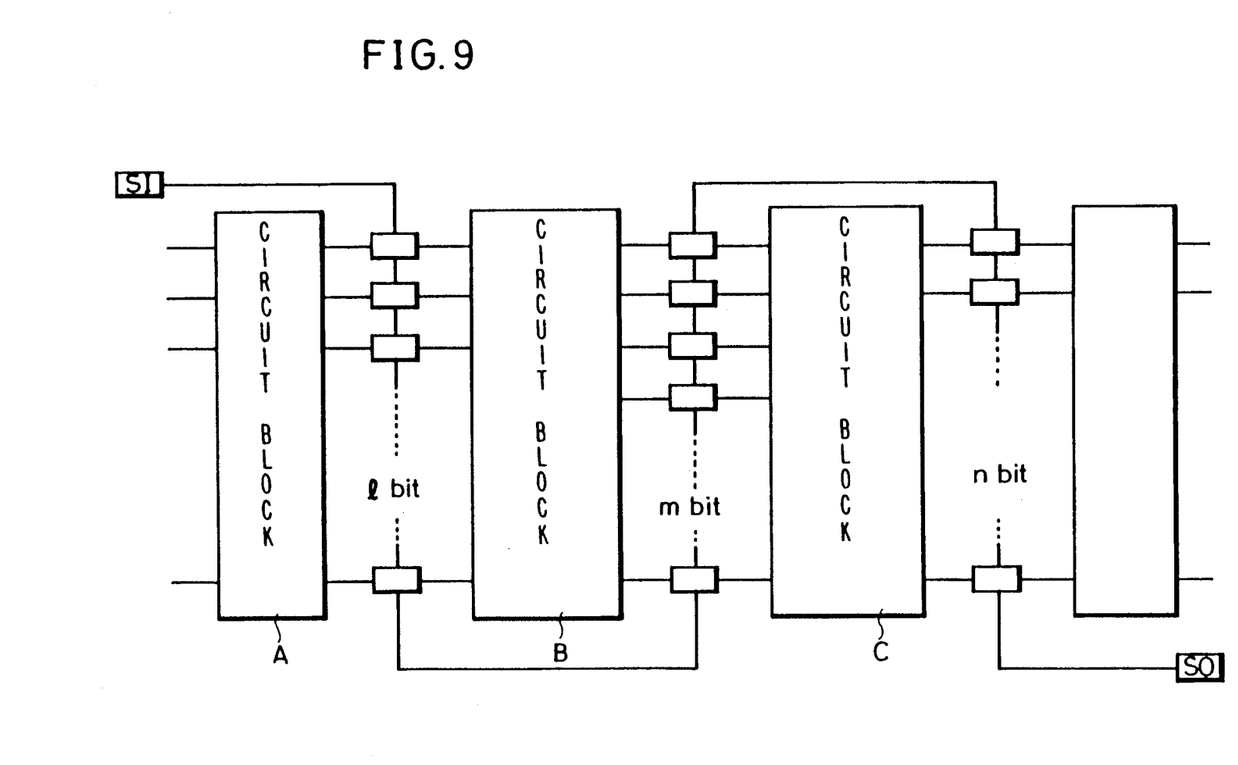
FIG. 9 is a schematic diagram of the circuit for testing integrated circuit devices in accordance with the present invention.

FIG. 9 is a schematic diagram for illustrating the effect of the present invention. Let us assume that the test pattern required for testing the circuit blocks 29 to 31 is the pattern a, and the test is effected on the circuit block B having l bits of information transmitted from the circuit block A of the preceding stage and m bits of information transmitted to the circuit block C of the succeeding stage. In the prior art, $(l \times a)$ clocks are required for the scan-in operation, and $\{(m+n) \times a\}$ clocks are required for the scan-out operation, the total being $\{(l+m+n) \times a\}$ clocks. According to the present invention, $(l \times a)$ clocks are required for the scan in operation, and only $(m \times a)$ clocks are required for the scan out operation, the total being $\{(l+m) \times a\}$ clocks. Therefore, the number of clocks required for completing the test is smaller than that of the prior art by $(n \times a)$. The larger becomes the number of the circuit blocks, the smaller becomes the number of clocks required for testing compared with the prior art. This facilitates the design for testing and therefore, a large scale integrated circuit can be provided whose designing cost is small.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of controlling a test circuit for testing a circuit having a plurality of circuit blocks, said test circuit having a test signal circuit for providing test signals to and collecting response signals from at least one of said circuit blocks, said test signal circuit having a plurality of scan register stages, each including two latch circuits, each of said latch circuits including a pair of cross-coupled inverters, a first transfer gate at an input of a first one of said pair of cross-coupled inverters and a second transfer gate between said pair of latches, the method including the steps of:
   selecting at least one of said circuit blocks to be tested;
   supplying a plurality of clock signals suitable for rendering said transfer gates alternately conductive to respective ones of said transfer gates corresponding to a circuit block which has been selected to transfer a pattern of said test signals under control of said clock signals thereto; and
   supplying a constant signal suitable for rendering said transfer gates corresponding to a circuit block which has not been selected simultaneously conductive,
   whereby test signals appearing at an input of ones of said scan registers corresponding to a circuit block which has not been selected are transferred therethrough without clocking.

2. A method according to claim 1, wherein said step of supplying a constant signal comprises the steps of:
   logically combining one of said plurality of clock signals with a non-select signal such that said logical combination is forced into a single logical state for the duration of said non-select signal.

3. In a shift register including a plurality of scan register stages, each including first and second latch circuits, each said first and second latch circuit including a pair of cross-coupled inverters, each of said scan register stages further including a first transfer gate at an input of a first one of said pair of cross-coupled inverters to control input of a signal to said first latch circuit in accordance with a first clock signal and a second transfer gate between said pair of latches to control transfer of a signal from said first latch circuit to said second latch circuit in accordance with a second clock signal, the improvement comprising;
   means for providing selection signals corresponding to selected and non-selected scan register stages of said shift register; and
   means responsive to said selection signals for forcing each of said first and second clock signals provided to non-selected scan register stages into respective predetermined logic states,
   whereby both of said first and second transfer gates transfer input signals to said first and second latches, respectively, and causing input signals to each non-selected scan register stage to be immediately propagated therethrough and buffered thereby.

4. A circuit for testing an integrated circuit device transferring data of several bits between each of a plurality of logic circuits (29, 30, 31) and for testing by a scan test method respective functions of each of said logic circuit blocks, comprising:
   a test date input terminal (2) receiving serial test data for a scan test of said logic circuits;
   a clock input terminal (1, 6) for receiving an external clock signal;
   a plurality of scan register means (8-16) provided between each of said logic circuit blocks in correspondence with the number of bits of the transferred data, each of said scan register means, responsive to a respective control signal, selectively receiving and storing data supplied by (i) the logic circuit block in a preceding stage, and (ii) test data inputted to said test data input terminal in synchronization with a clock signal inputted to said clock input terminal in a test mode of operation, and being connected with each other by a shift register path so as to have a function of one shift register as a whole;
   data selecting means (20-28) connected to respective ones of said scan register means, selecting output data of the corresponding logic circuit block of the preceding stage in normal operation, selecting output data of the corresponding scan register means in test operation, to output the respective selected data to the logic circuit block of the succeeding stage;
   register selecting means (51-56) for selectively supplying said respective control signals to said scan register means thereby making scan register means transparent other than the scan register means corresponding to the logic circuit to be tested; and
   an output terminal (32) for outputting data supplied by the last stage of said scan register means.

5. A circuit for testing an integrated circuit device according to claim 4, further comprising
   a mode switching signal input terminal (7, 44) receiving a mode switching signal for selectively operating said testing circuit in (i) a normal operation mode in which the output signal from said logic circuit block of the preceding stage is outputted to the logic circuit block of the succeeding stage, (ii) a scan mode in which the test data inputted to said test data input terminal is scanned by each of said scan register means, and (iii) a test mode in which data set in each of said scan register means is outputted to respective logic circuit blocks in the succeeding stage in parallel to test said logic circuit blocks; wherein each of said scan register means comprises means for outputting the output signal of the corresponding logic circuit block to the logic circuit block of the succeeding stage in response to a normal operation mode signal received at said mode switching signal input terminal, for scanning serially the test data inputted to said test data input terminal in response to a scan mode signal received at said mode switching signal input terminal, and for outputting stored data in response to the application of the test mode signal received at said mode switching signal input terminal.

6. A circuit for testing an integrated circuit device according to claim 5, wherein said scan register means comprises a clock input terminal (T1, T2) to which a clock signal is inputted, and latch means (35, 36, 38, 39) responsive to the clock signal inputted to said clock input terminal for latching data; and said register selecting means (51-56) comprises gate means applying a signal to the clock input terminal of said scan register means for making said latch means transparent.

7. A circuit for testing an integrated circuit device according to claim 4, wherein said scan register means comprises a first clock input terminal (T1) to which a first clock signal is applied;

a first transmission gate (33) having a scan mode data input terminal for receiving scan mode data, said first transmission gate (33) becoming conductive in response to said first clock signal for supplying said scan mode data;

a second clock input terminal (TD) to which a second clock signal is applied;

a second transmission gate (34) having a normal mode data input terminal for receiving normal mode data, said second transmission gate (34) becoming conductive in response to said second clock signal for supplying normal mode data supplied from said logic circuit block;

first latch means (35, 36) receiving said normal and scan mode date by said first and second transmission gates (33, 34), respectively, and latching said data;

a third clock input terminal (T2) to which a third clock signal in applied;

a third transmission gate (37) receiving said data latched by said first latch means (35, 36) and becoming conductive in responsive to said third clock signal for supplying said data latched by said first latch means; and second latch means (38, 39) for latching said data supplied by said third transmission gate.

8. A circuit for testing an integrated circuit device according to claim 5, wherein said scan register means comprises a first clock input terminal (T1) to which a first clock signal is applied;

a first transmission gate (33) having a scan mode data input terminal for receiving scan mode data, said first transmission gate (33) becoming conductive in response to said first clock signal for supplying said scan mode data;

a second clock input terminal (TD) to which a second clock signal is applied;

a second transmission gate (34) having a normal mode data input terminal for receiving normal mode data, said second transmission gate (34) becoming conductive in response to said second clock signal for supplying normal mode data supplied from said logic circuit block;

first latch means (35, 36) receiving said normal and scan mode data by said first and second transmission gates (33, 34), respectively, and latching said data;

a third clock input terminal (T2) to which a third clock signal in applied;

a third transmission gate (37) receiving said data latched by said first latch means (35, 36) and becoming conductive in responsive to said third clock signal for supplying said data latched by said first latch means; and second latch means (38, 39) for latching said data supplied by said third transmission gate.

9. A circuit for testing an integrated circuit device transferring data of several bits between each of a plurality of logic circuits (29, 30, 31) and testing by scan test method respective functions of each of said logic circuit blocks, comprising:

a test data input terminal (2) receiving serial test data for a scan test of said logic circuits;

a test data output terminal (32) for supplying serial output data from said logic circuits;

a plurality of scan register means (8-16) provided between each of said logic circuit blocks in correspondence with the number of bits of the transferred data, each of said scan register means responsive to first and second clock signals for selectively operating in (i) a synchronous mode wherein data applied to said scan register means is latched by said scan register means responsive to said first clock signal, said latched data supplied at an output terminal of said scan register means responsive to said second clock signal, and (ii) an asynchronous mode wherein a data signal applied to said scan register means is substantially immediately supplied at said output terminal, said scan register means selectively receiving data supplied by (i) the logic circuit block in a preceding stage, and (ii) test data inputted to said test data input terminal in synchronization with a one of said first and second clock signals in a test mode of operation, and being connected with each other by a shift register path so as to have a function of one shift register as a whole;

data selecting means (20 28) connected to respective ones of said scan register means, selecting output data of the corresponding logic circuit block of the preceding stage in normal operation, selecting output data of the corresponding scan register means in test operation, to output the respective selected data to the logic circuit block of the succeeding stage, said data output terminal (32) supplying data supplied by the last stage of said scan register means; and register selecting means (51 56) for selectively supplying said respective control signals to said scan register means thereby making transparent scan register means other than the scan register means corresponding to the logic circuit to be tested.

10. A circuit for testing an integrated circuit device according to claim 9, further comprising a mode switching signal input terminal (7, 44) receiving a mode switching signal for selectively operating said testing circuit in (i) a normal operation mode in which the output signal from said logic circuit block of the preceding stage is outputted to the logic circuit block of the succeeding stage, (ii) a scan mode in which the test data inputted to said test data input terminal is scanned by each of said scan register means, and (iii) a test mode in which data set in each of said scan register means is outputted to respective logic circuit blocks in the succeeding stage in parallel to test said logic circuit blocks; wherein each of said scan register means comprises means for outputting the output signal of the corresponding logic circuit block to the logic circuit block of the succeeding stage in response to a normal operation mode signal received at said mode switching signal input terminal, for scanning serially the test data inputted to said test data input terminal in response to a scan mode signal received at said mode switching signal input terminal, and for outputting stored data in response to the application of the test mode signal received at said mode switching signal input terminal.

11. A circuit for testing an integrated circuit device according to claim 9, wherein said scan register means comprises a clock input terminal (T1, T2) to which said first and second clock signals are supplied, and latch means (35, 36, 38, 39) responsive to the clock signal inputted to said clock input terminal for latching data; and said register selecting means (51 56) comprises gate means applying a signal to the clock input terminal of said scan register means for making said latch means transparent.

12. A circuit for testing an integrated circuit device according to claim 9, wherein said scan register means comprises a first clock input terminal (T1) to which said first clock signal is applied;

a first transmission gate (33) having a scan mode data input terminal for receiving scan mode data, said first transmission gate (33) becoming conductive in response to said first clock signal for supplying said scan mode data;

a second clock input terminal (TD) to which a second clock signal is applied;

a second transmission gate (34) having a normal mode data input terminal for receiving normal mode data, said second transmission gate (34) becoming conductive in response to said second clock signal for supplying normal mode data supplied from said logic circuit block;

first latch means (35, 36) receiving said normal and scan mode data by said first and second transmission gates (33, 34), respectively, and latching said data;

a third clock input terminal (T2) to which a third clock signal in applied;

a third transmission gate (37) receiving said data latched by said first latch means (35, 36) and becoming conductive in responsive to said third clock signal for supplying said data latched by said first latch means; and second latch means (38, 39) for latching said data supplied by said third transmission gate.

13. A circuit for testing an integrated circuit device according to claim 10, wherein said scan register means comprises a first clock input terminal (T1) to which a first clock signal is applied;

a first transmission gate (33) having a scan mode data input terminal for receiving scan mode data, said first transmission gate (33) becoming conductive in response to said first clock signal for supplying said scan mode data;

a second clock input terminal (TD) to which a second clock signal is applied;

a second transmission gate (34) having a normal mode data input terminal for receiving normal mode data, said second transmission gate (34) becoming conductive in response to said second clock signal for supplying normal mode data supplied from said logic circuit block;

first latch means (35, 36) receiving said normal and scan mode data by said first and second transmission gates (33, 34), respectively, and latching said data;

a third clock input terminal (T2) to which a third clock signal in applied;

a third transmission gate (37) receiving said data latched by said first latch means (35, 36) and becoming conductive in responsive to said third clock signal for supplying said data latched by said first latch means; and second latch means (38, 39) for latching said data supplied by said third transmission gate.

* * * * *